United States Patent [19]

Lin

[11] Patent Number: 5,348,316
[45] Date of Patent: Sep. 20, 1994

[54] DIE COLLET WITH CAVITY WALL RECESS

[75] Inventor: Peng-Cheng Lin, Cupertino, Calif.

[73] Assignee: National Semiconductor Corporation, Santa Clara, Calif.

[21] Appl. No.: 914,950

[22] Filed: Jul. 16, 1992

[51] Int. Cl.$^5$ .................. H05K 13/04; B25B 11/00
[52] U.S. Cl. ........................ 279/3; 228/44.7; 269/21
[58] Field of Search .............. 279/3; 228/44.7; 269/21; 294/64.1; 901/40

[56] References Cited

U.S. PATENT DOCUMENTS

| | | | |
|---|---|---|---|
| 3,676,911 | 7/1972 | Austin | 228/44.7 X |
| 4,589,586 | 5/1986 | Polansky | 279/3 X |

FOREIGN PATENT DOCUMENTS

| | | | |
|---|---|---|---|
| 18337 | 1/1982 | Japan | 269/21 |
| 669139 | 2/1989 | Switzerland | 269/21 |

OTHER PUBLICATIONS

Product Brochure of small precision tools, revised Aug. 1990–1991.
Product Brochure of AMI Advanced Mechanization, Inc. "Solder-Mount Die Attach System." (no date).

*Primary Examiner*—Steven C. Bishop
*Attorney, Agent, or Firm*—Townsend and Townsend Khourte and Crew

[57] ABSTRACT

The invention provides a method and apparatus for picking a separated semiconductor die 128 from a wafer and placing it on a die attach pad 144 for bonding thereto. In a preferred embodiment, the apparatus comprises a die collet having a body 124 with a proximal end 123 and a distal end 125; at least one pair of spaced-apart walls 136 extending distally from the distal end of the body and having opposing faces 181 defining an aperture 126, the faces of the walls being sloped such that a distal portion of the aperture is wider than the die and a proximal portion of the aperture is narrower than the die; a recess 152 on the faces of the walls extending substantially the length of the die, the recess having a distally-facing surface 154 for contacting at least a portion of the top side 138 of the die; and means for holding the die in the aperture, usually including a vacuum port 128. The method comprises providing a collet like the aforementioned; positioning the aperture 126 over a die 120; exerting a vacuum pressure through the vacuum port 128 to retain the die in the aperture such that a portion of the top side contacts the distally-facing surface 154 of the recess 152; positioning the die over the pad 144 such that the bottom side of the die is parallel to the pad; and discontinuing the vacuum pressure to release the die from the aperture.

14 Claims, 11 Drawing Sheets

DIE COLLET WITH CAVITY WALL RECESS

BACKGROUND OF THE INVENTION

The present invention relates generally to bonding of semiconductor dies in integrated circuit (IC) packages, and more specifically to die collets for picking separated semiconductor dies from a wafer and placing the dies on a die attach pad, lead frame or seating plane to which the die is bonded.

FIG. 1 illustrates a conventional technique for separating a semiconductor die from a silicon wafer. The wafer 10 is mounted on expandable adhesive film 12 secured at its edges by clamps 14. Disposed beneath adhesive film 12 is expansion frame 16 movable in the direction of arrow 18 such that expansion frame 16 pushes upward on film 12 distending it vertically and stretching it horizontally, providing a tense, flat surface on which wafer 10 resides.

Dies 20 are separated from wafer 10 by sawing cuts 22 at the edges of each die. The result is a plurality of edges 20, usually rectangular in shape, mounted on film 20 and separated by the saw kerf at cuts 22.

For placement of the dies on a die attach pad of an integrated circuit (IC) package, each die 20 is lifted from film 12 by a collet 24, which is usually mounted at the end of a pick-and-place device, such as a robot arm or other mechanical actuator. Die collets for placement of semiconductor dies on die attach pads for bonding are known in the art, and are commercially available from, for example, Small Precision Tools of Petaluma, Calif. Automated die attach systems employing die collets like the aforementioned are also well known, being commercially sold by, for example, Advanced Mechanization Incorporated of Horsham, Penna.

As shown in FIG. 2, the collet 24 has an aperture 26 at its distal end and a vacuum hole 28 extending through the length of collet 24 through which a vacuum pressure is exerted for lifting die 20. Aperture 26 has four sloped walls 30 which, at the distal end of aperture 26 are spaced apart a distance such that die 20 can fit within aperture 26.

As shown in FIGS. 3A and 3B, walls 30 of aperture 26 are sloped at an angle such that a gap 34 is disposed between the top of die 20 and end surface 36 of aperture 26. Gap 34 is provided so as to avoid damaging the top surface 38 of die 20. Thus, contact between collet 24 and die 20 is limited to the corners 40 of die 20.

Referring again to FIG. 1, a die 20 is lifted by collet 24 from film 12 by positioning aperture 26 over a die 20, exerting a vacuum pressure in the direction of arrow 32 and simultaneously moving an ejector pin 42 upwardly against the lower surface of film 12. Ejector pin 42 assists collet 24 in removing die 20 from adhesive film 12. Collet 24 is then moved upwardly away from film 12, with die 20 preferably in a position shown in FIG. 3A.

Collet 24 is then positioned over a die attach pad or lead frame where the die is to be bonded. As shown in FIG. 4, the die 20 is placed over pad 44 with a layer of bonding material 46, such as solder, disposed between die 20 and pad 44. Heat is then applied, usually through pad 44, so as to melt solder 46, bonding die 20 to pad 44.

Using this known technique of die placement, several significant problems may arise. One such problem is shown in FIG. 5. As shown by the dotted line, die 20 can become tilted in aperture 26 of collet 24. This can occur for various reasons, such as the upward force of ejector pin 42 when the die is removed from film 12, the force of vacuum pressure through vacuum hole 28, the inertial force as the collet is moved in position over a die attach pad, or the uneven surface of the solder layer 46.

Whatever the reason, the result of the tilting of die 20 is shown in FIG. 6. Die 20 is bonded in a tilted position, with bonding material 46 having a thickness greater on one side than on the other. The tilt of die 20 and the varied thickness of bonding material 46 may lead to device failure during electrical test or during operation in the field because of the uneven thermal gradient across the die.

Another significant problem which arises in known processes is chipping or cracking of the corners of die 20. Such chipping or cracking can take the form shown in FIG. 7, wherein corners 40 contacting walls 30 of aperture 26 have been damaged either when the die 20 is lifted from film 12, or when die 20 is bonded to pad 44. Further, chipping and cracking can occur also at the lower corner 50 of die 20, in the illustration of FIG. 6. This is thought to result from the concentration of stresses at corner 50 when a tilted die in collet 24 is placed on pad 44.

A further problem results from the requirement that aperture 26 be sealed at edges 40 of die 20 in order to provide a proper vacuum seal to retain die 20 in the aperture. Known collets suffer from poor sealing, and have a significant incidence of dropped dies.

Moreover, these problems with tilted and damaged die result in a significant amount of machine down time in the manufacturing process. Currently, when a die is tilted in the aperture 26 of die collet 24, or corners 40 of die 20 are chipped or cracked, either the die is placed on the bonding pad and bonded in the tilted or cracked condition, or, if the machine operator notices the problem, the die attach machine must be stopped to adjust the position of the die so that it will be placed parallel to the die attach pad. A cracked or chipped die must be discarded and replaced.

Accordingly, a method and apparatus for placing a die on a die attach pad or lead frame is desired which would (a) maintain the back surface of the die in a desired plane, (b) reduce or avoid die cracking and/or chipping on or around the corners and edges of the die, (c) achieve a uniform thickness of bonding material between the die and the pad or lead frame, (d) reduce machine downtime attributed to correcting the tilting problems and recovering dropped dies, and (e) reduce the defect rate and test yield loss due to poor attachment of dies.

SUMMARY OF THE INVENTION

The present invention provides a method and apparatus for placing a semiconductor die on an attachment pad, lead frame or seating plane of an IC device. In one embodiment of the apparatus of the present invention, a collet is provided for placing a semiconductor die on an attachment pad, the die having a bottom side for attaching to the pad and a top side opposite the bottom side, the collet comprising a body having a proximal end and a distal end; means disposed at the distal end of the body for maintaining the top side of the die in a position spaced apart from the distal end; means disposed at the distal end of the body for maintaining the die in a position relative to the body in at least one direction parallel to said pad; means disposed at the distal end of the body for maintaining the bottom side of the die in a plane parallel to said pad; and means for lifting the die.

In an exemplary embodiment, the means for maintaining the die in a position relative to the body in at least one direction parallel to the pad comprises at least one pair of spaced apart walls extending from the distal end of the body, the walls having opposing faces defining an aperture into which the top side of the die extends.

In a further embodiment, the means for maintaining the top side of the die in a position spaced apart from the distal end of the body comprises a slope on the faces of the walls such that a distal portion of the aperture is wider than the die and the proximal portion of the aperture is narrower than the die.

In still another embodiment, the means for maintaining the bottom side of the die in a plane parallel to the pad comprises a recess disposed in the faces of the walls and extending substantially the length of the die, the recess having a distally-facing surface for contacting at least a portion of the top side of the die.

In another aspect of the present invention, a method is provided for placing a semiconductor device on an attachment surface for bonding thereto, the device having a bottom side for bonding to the attachment surface and a top side opposite the bottom side, the method comprising the steps of providing a collet having at least one pair of spaced apart walls extending in a distal direction, the walls having opposing sloped faces defining an aperture widest at its distal end, a recess disposed on said faces extending the length of the device and having a distally-facing surface, and a vacuum port disposed between the walls; positioning the aperture over a device; exerting a vacuum pressure through the vacuum port to retain the device in the aperture, a portion of the top side of the device contacting the distally-facing surface of the recess; positioning the device over the attachment surface such that the bottom side of the device is substantially parallel to the surface; and discontinuing the vacuum pressure to release the device from the aperture. The device may be a single semiconductor die, or a subassembly having one or more dies and/or substrates mounted together.

The present invention provides a method and apparatus for placing a semiconductor device on an attachment surface which overcome several of the aforementioned problems of known die placement techniques. In particular, the apparatus and method of the present invention maintain the device in a desired plane, eliminating the tilting problems of prior devices. In addition, the invention greatly reduces problems with cracking and/or chipping on or around the corners and edges of the die associated with known die placement methods. Further, an improved vacuum seal is obtained to reduce the incidence of dropped die. As a result, die can be bonded to an attachment surface with a desired planar orientation, a uniform thickness of bonding material and without cracking or chipping of the die. Machine downtime is significantly reduced, and yield is substantially improved.

The invention and objects and features thereof will be more readily apparent from the following detailed description and appended claims when taken with the drawings.

DETAILED DESCRIPTION OF THE ILLUSTRATIVE EMBODIMENTS

Figure 1:
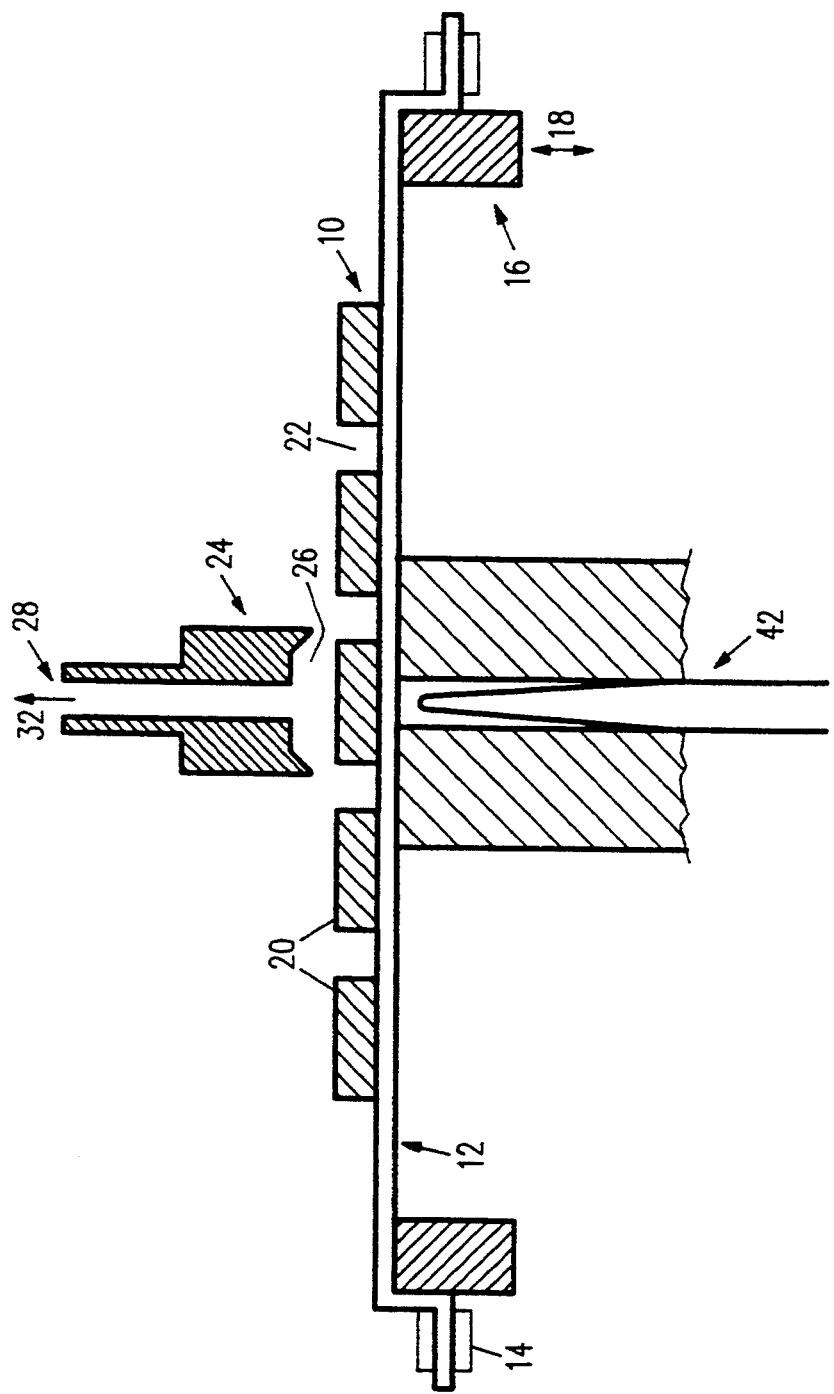
FIG. 1 is a front cross-sectional view of a known die collet and wafer mounting apparatus.
Figure 2:
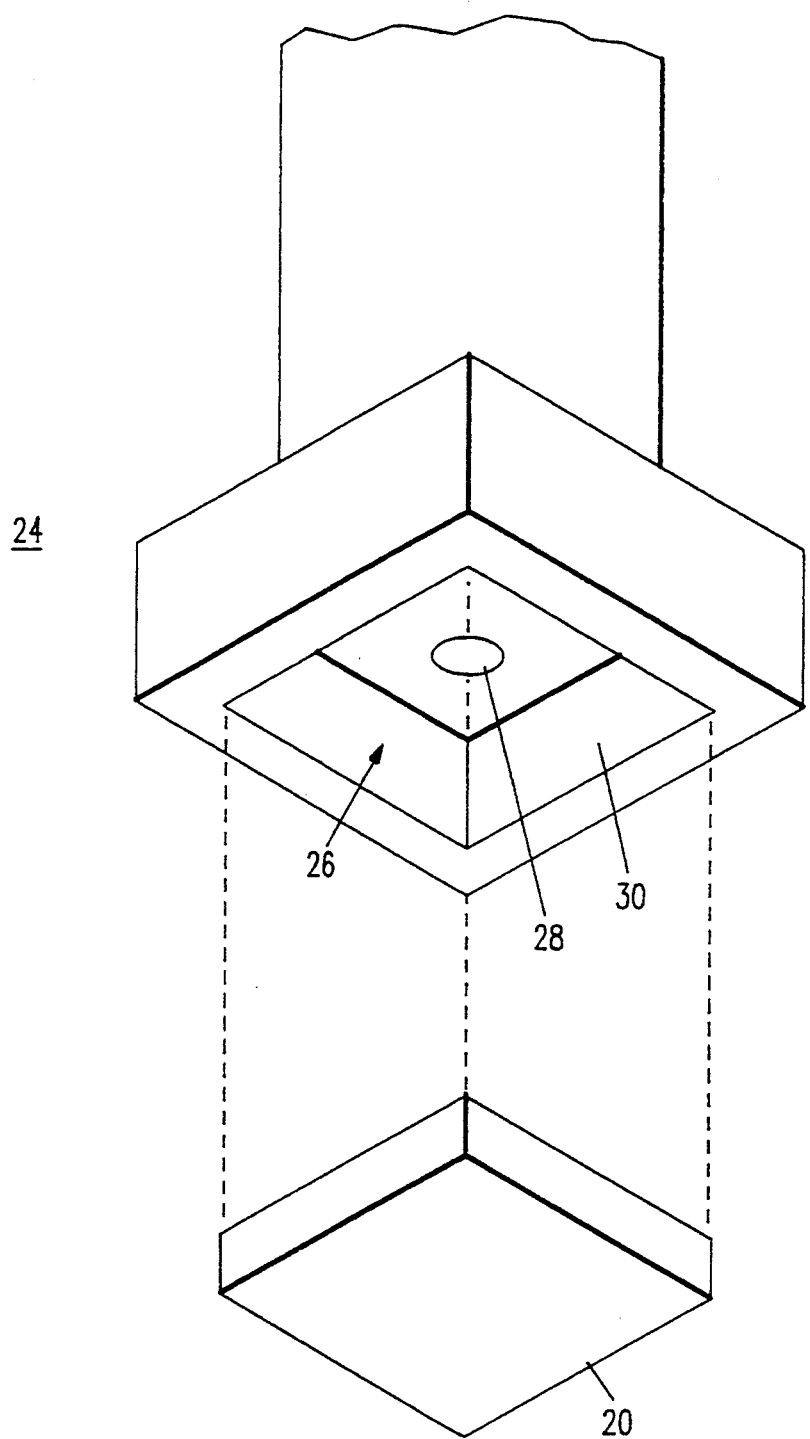
FIG. 2 is a perspective view of the die collet of FIG. 1.
Figure 3A:
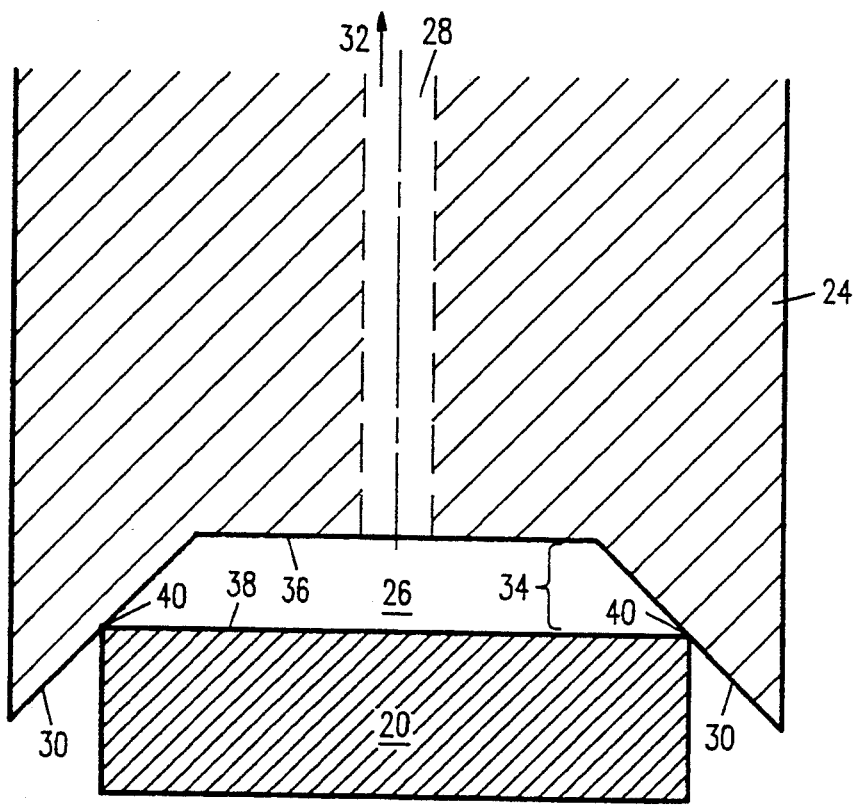
FIGS. 3A and 3B are front cross-sectional and bottom elevational views of the die collet of FIG. 1.
Figure 3B:
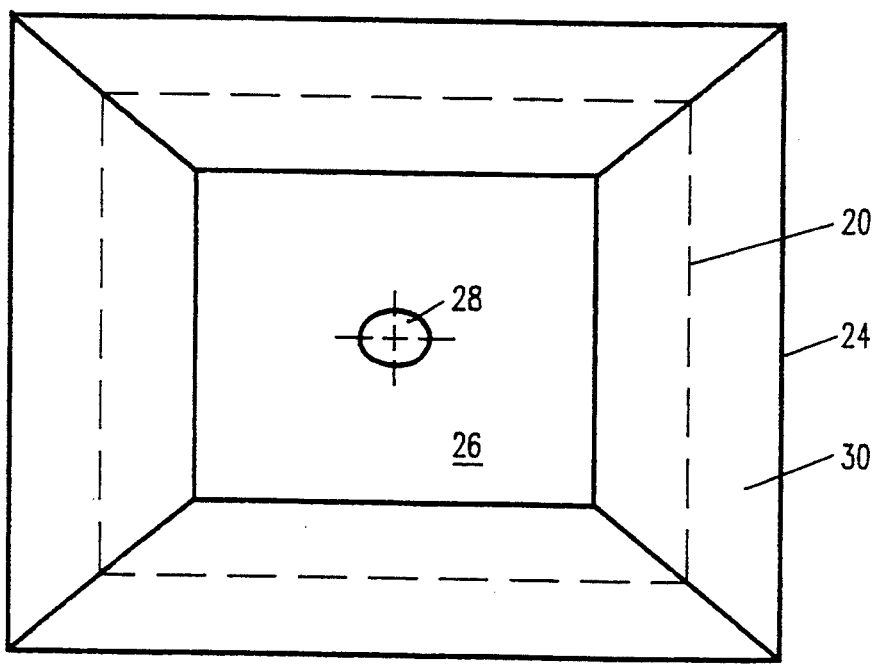
Figure 4:
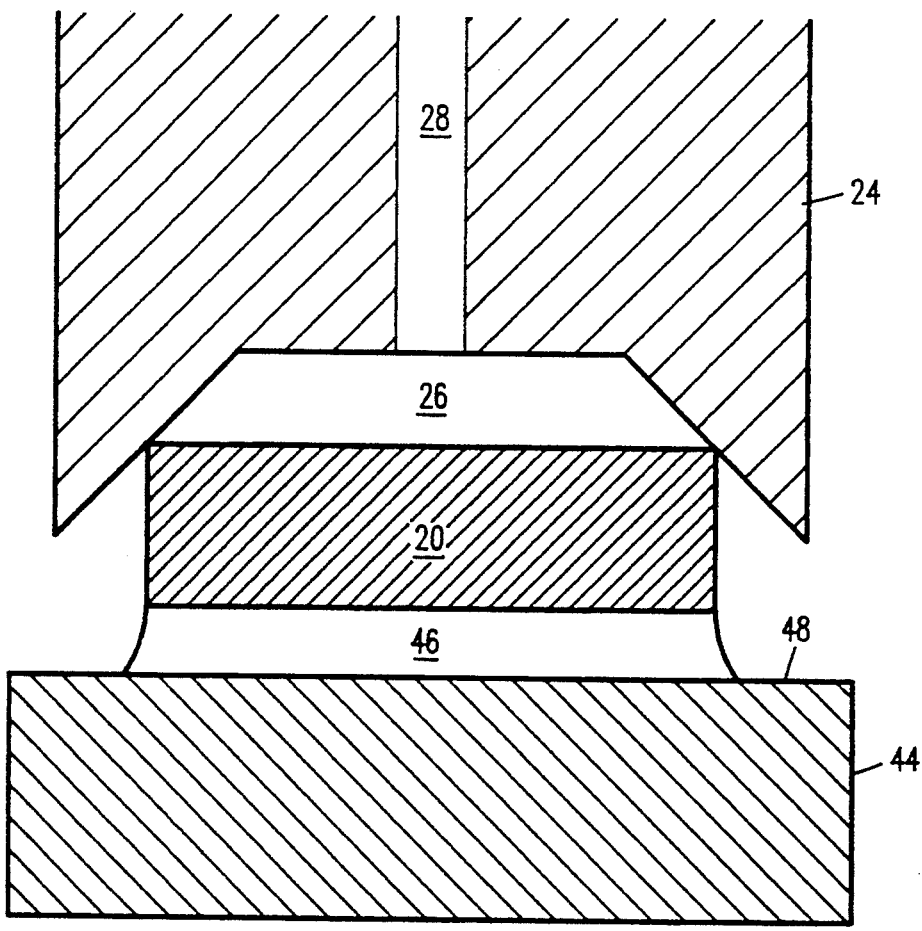
FIG. 4 is a front cross-sectional view of a die bonded to a die attach pad.
Figure 6:
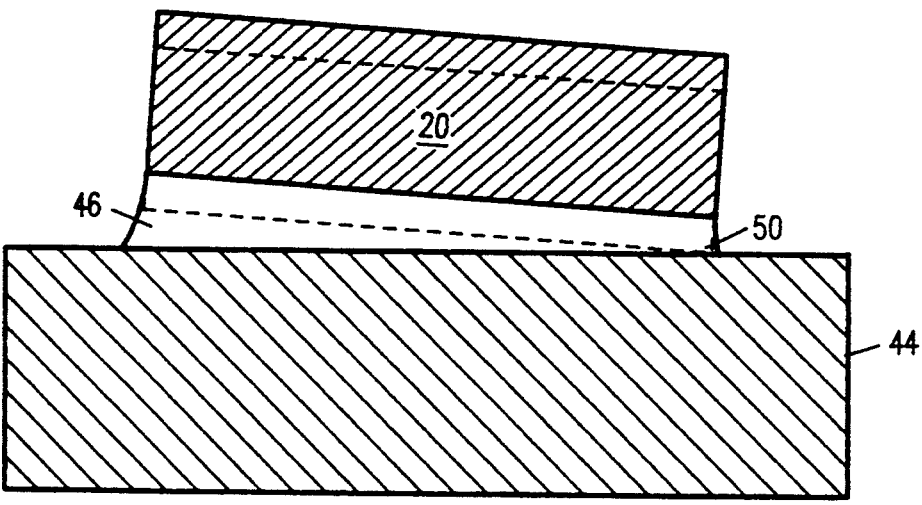
FIG. 6 is a front cross-sectional view of a die bonded to a die attach pad.
Figure 5:
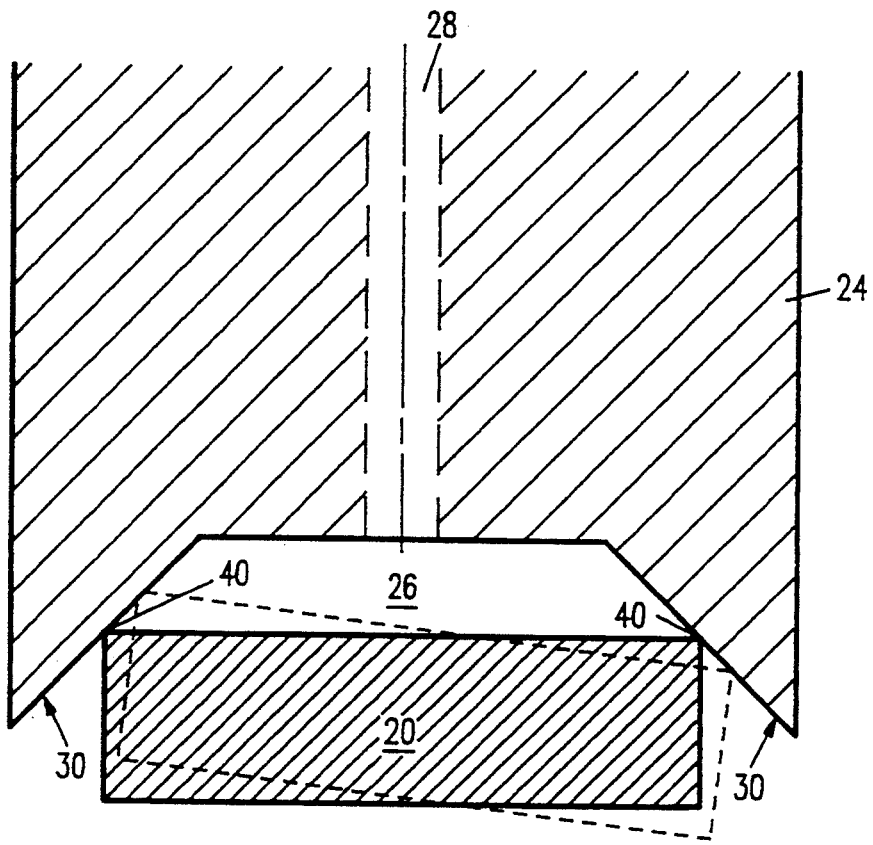
FIG. 5 is a front cross-sectional view of the collet of FIG. 1.
Figure 7:
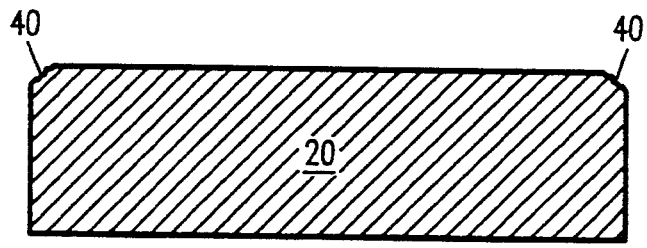
FIG. 7 is a front cross-sectional view of a die.
Figure 8A:
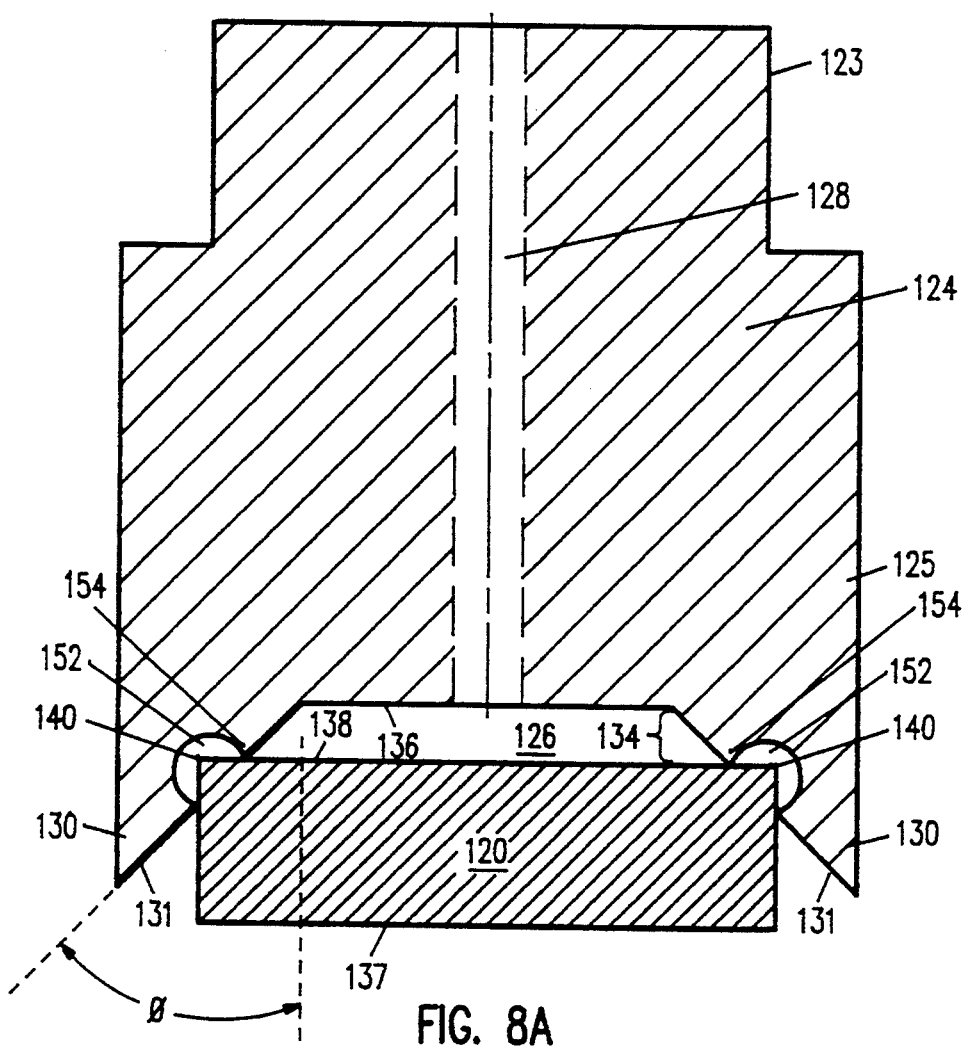
FIGS. 8A and 8B are front cross-sectional and bottom elevational views of the die collet of the present invention.
Figure 8B:
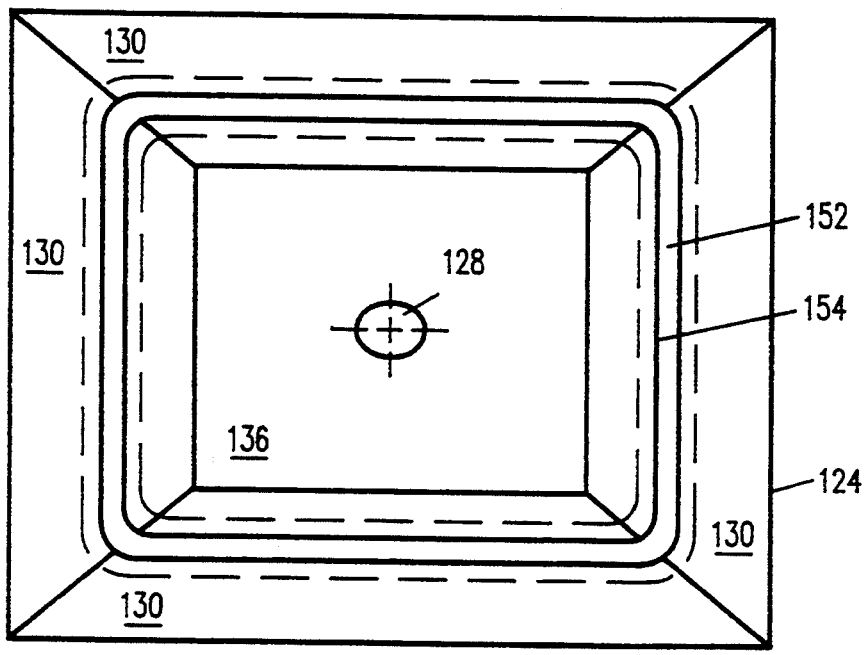

Referring to FIGS. 8A and 8B, the die collet of the present invention includes a body 124 having a proximal end 123 that may have various configurations depending upon the manner in which the collet is utilized. For example, proximal end 123 may be configured for coupling to a robotic arm or other actuator.

Distal end 125 of body 124 has four walls 130 extending distally therefrom, walls 130 having opposing sloped faces 131 defining an aperture 126 therebetween. The faces 131 of walls 130 are spaced a distance from each other such that the top side 138 of die 120 fits within aperture 126 while bottom side 137 of die 120 is disposed distally of the distal ends of walls 130. The slope angle $\theta$ of faces 131 may be, for example, between 30° and 90°, but may be greater or less depending upon the application. A vacuum port 128 extends from proximal end 123 to distal end 125, the distal opening of vacuum port 128 lying between walls 130.

A recess 152 is disposed on faces 131 of walls 130, the recess 152 having a distally-facing surface 154 for contacting top surface 138 of die 120. Recess 152 including surface 154 is configured and positioned such that a gap 134 is maintained between top side 138 of die 120 and end surface 136 of aperture 126. Gap 134 ensures that top side 138 of die 120 is not damaged by contact with surface 136. Recess 152 extends along face 131 of each wall 130 a distance at least as long as the corresponding dimension of die 120 such that all of corner edges 140 of die 120 lie within recess 152.

By contacting die 120 at a point interior to corners 140 on the top side of the die, corner edges 140 are protected from chipping or cracking. Further, distally-facing surfaces 154 ensure that die 120 remains in a desired planar position, eliminating the tilting problems associated with known devices. In addition, the collet of the present invention provides an improved seal around the surface of die 120 when vacuum pressure is exerted through vacuum port 128, thereby reducing the incidence of dropped dies due to vacuum leakage from aperture 126.

Figure 9:
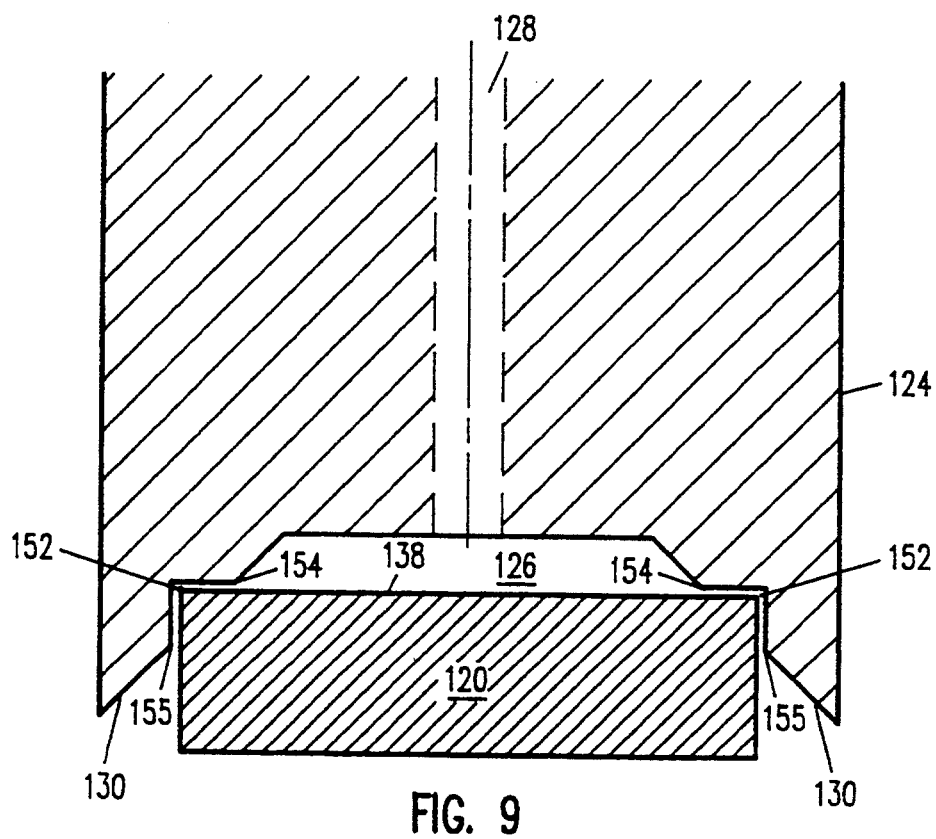
FIGS. 9-14 front cross-sectional views of alternative embodiments of the die collet of FIGS. 8A and 8B.
Figure 10:
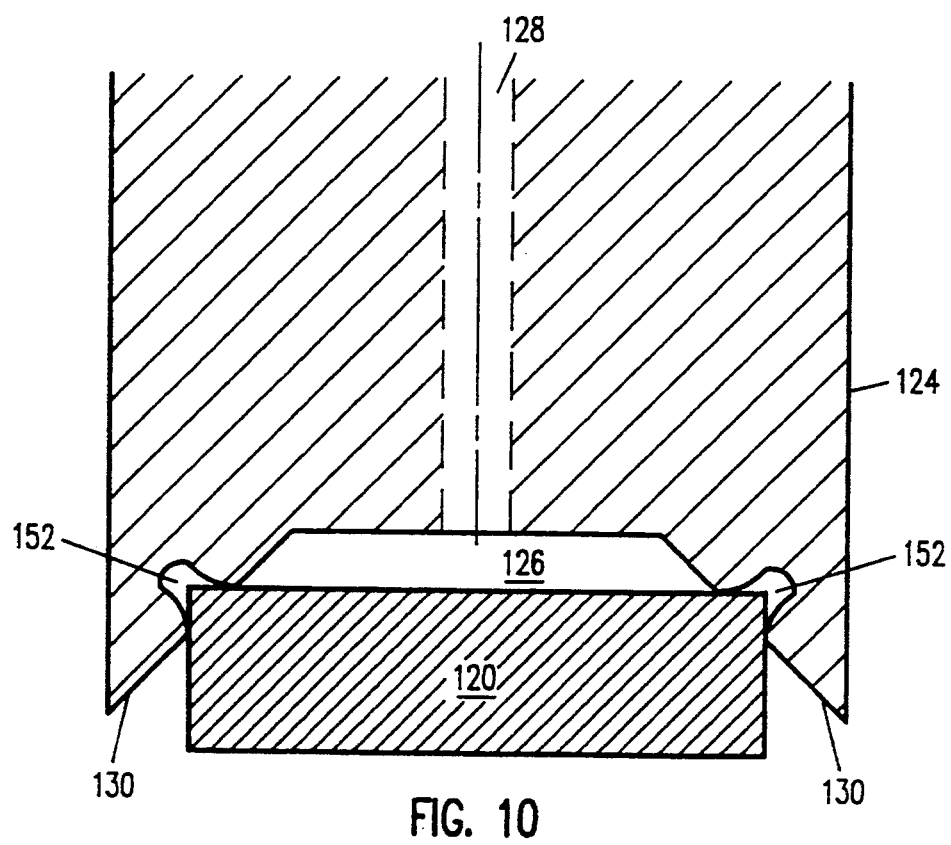
Figure 11:
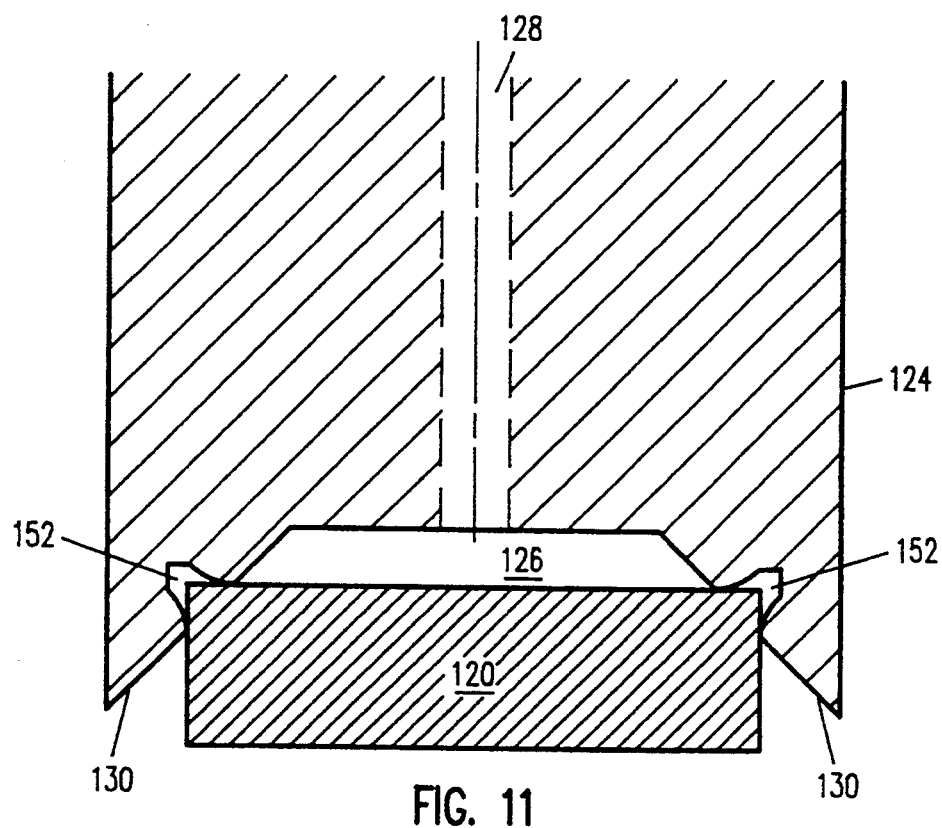
Figure 12:
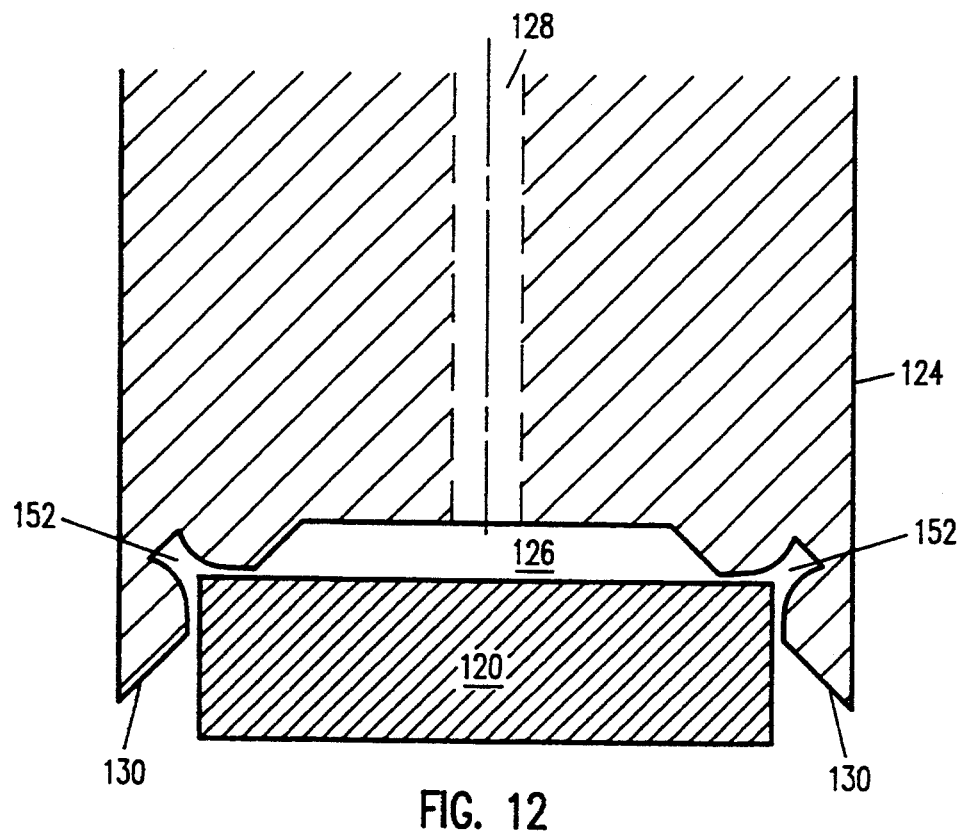
Figure 13:
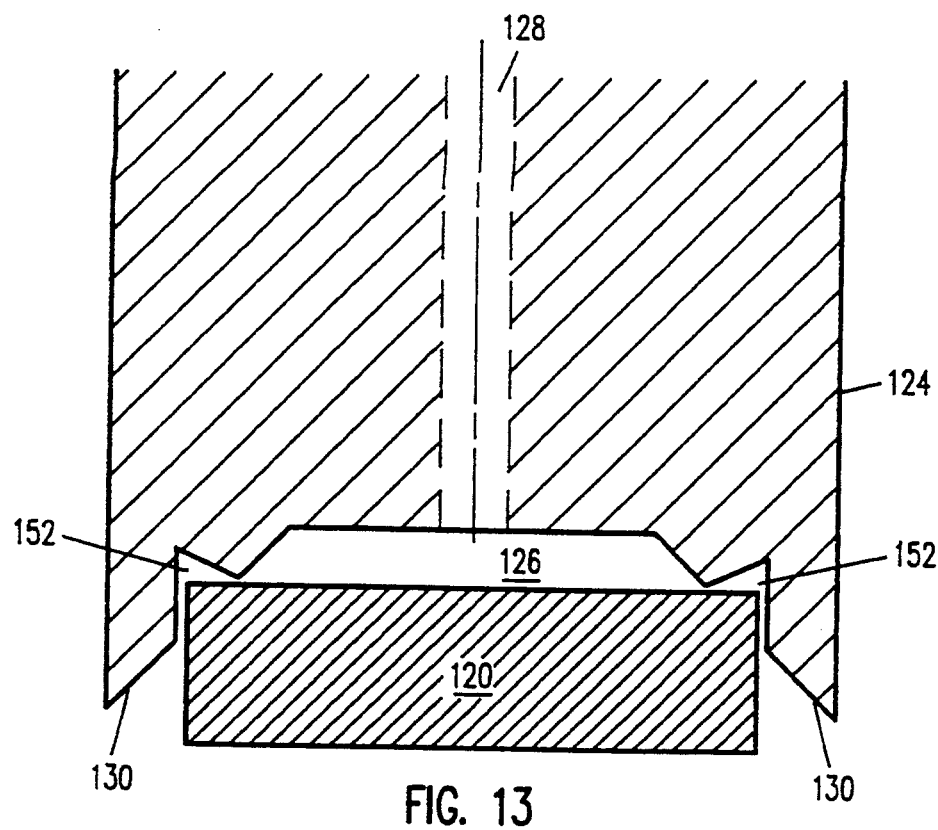
Figure 14:
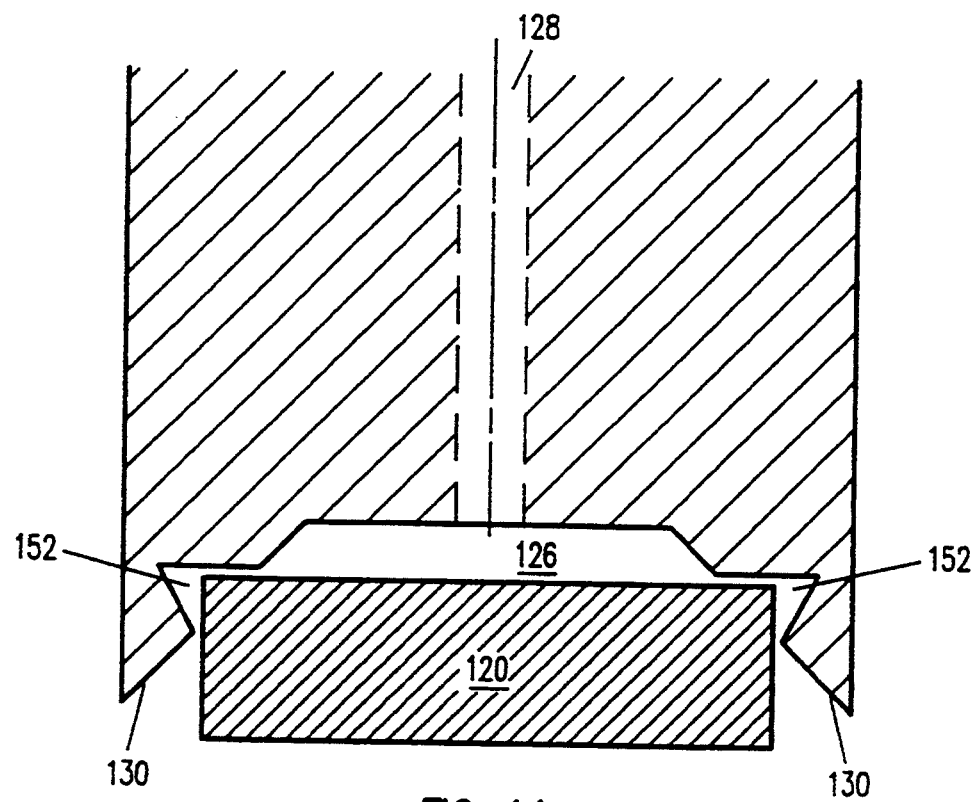

In a preferred embodiment, the cross-section of recess 152, as shown in FIG. 8A, is generally round with an open portion through which corner edges 140 extend. In a second preferred embodiment, recess 152, as illustrated in FIG. 9, has an angular configuration, with surface 154 being planar for contacting top side 138 of die 120, and a second surface 155 perpendicular to surface 154 and extending perpendicular therefrom in a distal direction adjacent the edges of die 120. This embodiment provides a particularly reliable seal on top side 138 of die 120 due to the larger area of contact between surface 154 and top side 138. Alternatively, recess 152 may have one of the various configurations illustrated in FIGS. 10-14.

It should be noted that while faces 131 of walls 130 are shown with a slope, the collet of the present invention may be provided with walls 130 having faces 131 which are substantially straight and parallel with the edges of die 120. The sloping faces 131 shown in the figures are preferred, however, since such a sloping configuration allows higher tolerance in the positioning accuracy required for positioning aperture 126 over die 120.

Figure 15:
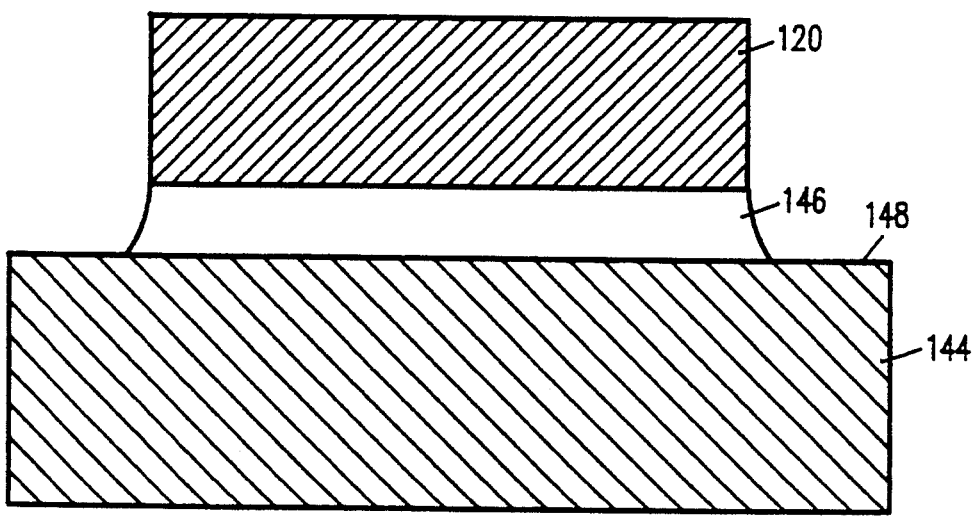
FIG. 15 is a front cross-sectional view of a die mounted to a die attach pad in accordance with the method of the present invention.

In the method of the present invention, a collet as shown in FIG. 8A is positioned over a die 120 such that the top side 138 extends into aperture 126, with corner edges 140 disposed in recess 152. Proximal end 123 of the collet may be coupled to a mechanical actuator or robotic arm. Vacuum pressure is exerted through vacuum port 128, drawing die 120 toward body 124 of the collet with top side 138 of die 120 contacting surface 154 of recess 152. Collet 124 is then positioned over a die attach pad or lead frame 144, depending upon the application. As illustrated in FIG. 15, a layer of bonding material, usually solder, is disposed on the top surface of the die attach pad, the die 120 being positioned on top of and contacting the bonding material. Die 120 is maintained in a horizontal and vertical position by walls 130 and the vacuum pressure through port 128, and is further maintained in a plane parallel to the die attach pad 144 by distally-facing surfaces 154 in recess 152.

In a preferred embodiment, bonding material 146 is solder, which may be solder ribbon or wire of a tin-lead mixture, which is solid at room temperature. Solder material 146 is heated, usually by heating die attach pad 144 using a heater block positioned thereunder, converting solder 146 to a molten state. Collet body 124 is then subject to movement in a plane parallel to the top surface 148 of bonding pad 144, a technique called "scrubbing," believed to improve the intermetallic diffusion between the die and the die attach pad. Usually, the scrubbing motion is circular, and does not extend beyond the edges of die attach pad 44. Alternatively, the scrubbing motion can be a linear back- and-forth motion in one or more directions over the die attach pad. During the scrubbing motion, recesses 152 ensure that die 120 is maintained in a fixed position relative to body 124 of the collet and remains parallel to bonding surface 48 of die attach pad 44.

After scrubbing, vacuum pressure through vacuum hole 128 is discontinued and collet body 124 retracted away from die 120. Heating of solder 146 is discontinued so that solder 146 returns to a solid state, thereby bonding die 120 to die attach pad 144. The bonded die is now ready for subsequent process steps.

As shown in FIG. 15, using the apparatus and method of the present invention, the bonded die is substantially parallel to die attach pad 144, and thickness of bonding material 146 is uniform throughout the bonding area. Further, die 120 is left substantially intact, without cracks or chips at its corner or edge surfaces.

Figure 16A:
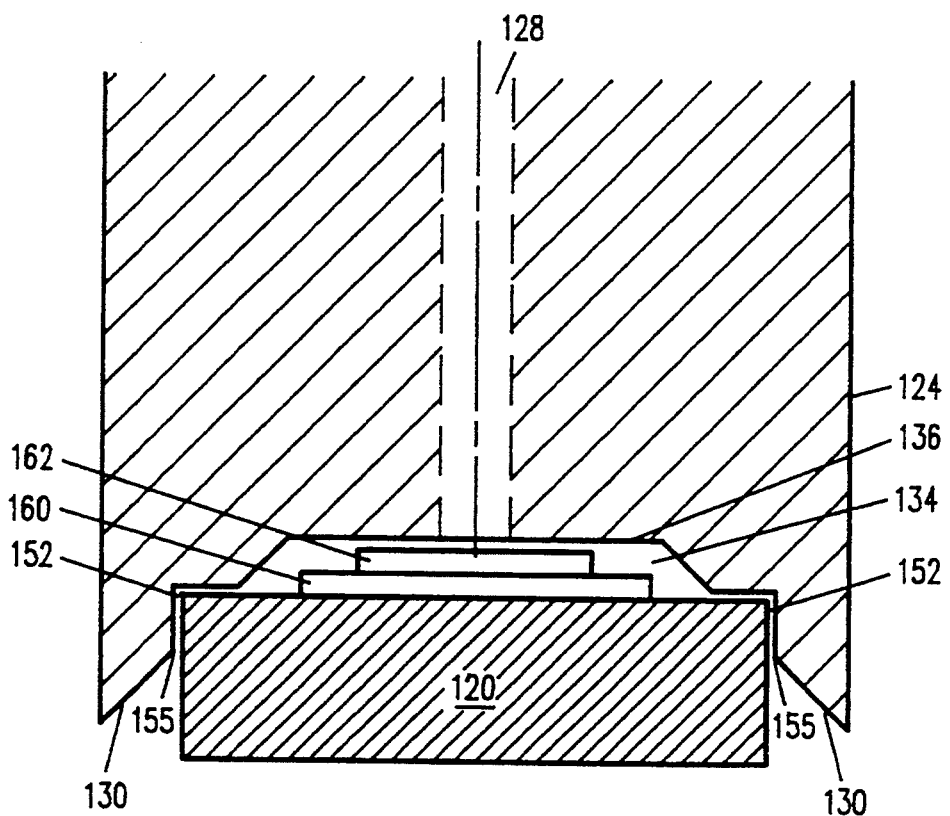
FIGS. 16A and 16B are front cross-sectional views of the die collet of the present invention lifting electronic sub-assemblies.
Figure 16B:
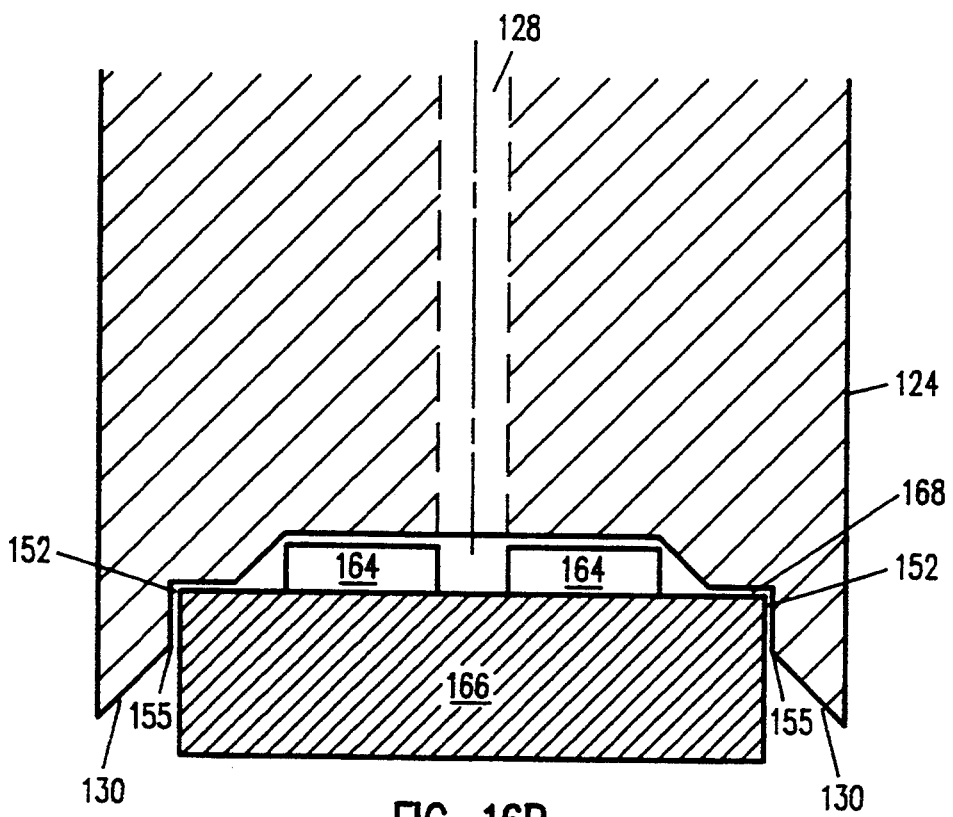

The invention is further suited to lifting and placing prefabricated electronic sub-assemblies on a surface for bonding thereto. Two examples are shown in FIGS. 16A-16B. In FIG. 16A, a substrate 160 is mounted on a first die 120, and a second die 162 is mounted on the substrate. In this embodiment, recesses 152 are positioned such that gap 134 is large enough to accommodate substrate 160 and second die 162 between first die 120 and end surface 136 of the collet. In the example of FIG. 16B, one or more dies 164 are mounted on the surface of a substrate 166, which is lifted by the collet. Corners 168 of substrate 166 extend into recesses 152 of the collet, thereby maintaining the horizontal and vertical alignment of the substrate. In this embodiment, the substrate is placed on another surface, such as a die attach pad or second substrate, to which it is bonded. Various other types of sub-assemblies may also be placed for bonding using the collet of the present invention.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A collet for placing a prefabricated electronic sub-assembly on an attachment surface, said subassembly comprising a substrate having a bottom side for attaching to said attachment surface and a top side opposite said bottom side, and at least one die mounted on said top side of said substrate, said collet comprising:
    a body having a proximal end and a distal end;
    a first surface recessed in said distal end, said first surface having a configuration to receive said top surface of said substrate, whereby said bottom side of said substrate is maintained in a plane parallel to said attachment surface;
    a second surface recessed in said distal end spaced from and parallel with said first surface to accommodate said die mounted on said substrate;
    at least one pair of spaced-apart walls extending from said distal end of said body, said walls having opposing faces defining an aperture into which said top surface of said substrate extends, whereby said sub-assembly is maintained in a position relative to said body in at least one direction parallel to said attachment surface; and
    means disposed at said distal end of said body for holding said subassembly.

2. The collet as in claim 1, wherein said first recessed surface extends substantially the length of said substrate.

3. The collet of claim 1 wherein said means for holding comprises a vacuum port disposed in said distal end of said body between said walls for exerting a vacuum pressure in said aperture.

4. The collet of claim 1 further comprising a second pair of spaced apart walls perpendicular to said first pair, said two pairs of walls defining a four-sided aperture.

5. The collet of claim 1, wherein a portion of said first surface is receded, whereby contact between said first surface and said substrate at edges surrounding said substrate is minimized.

6. The collet of claim 5, wherein said recessed portion of said first surface is at least partially round in cross-section.

7. The collet of claim 1, wherein said first pair of walls is perpendicular to said first recessed surface, said walls extending distally from said first surface.

8. A collet for placing a prefabricated electronic sub-assembly on an attachment surface, said sub-assembly comprising a bottom die having a bottom side for attaching to said attachment surface and a top side opposite said bottom side, a substrate having a bottom side and a top side, said bottom side of said substrate attached to said top side of said bottom die, and a top die mounted on said top surface of said substrate, the collet comprising:

a body having a proximal end and a distal end;

a first surface recessed in said distal end, said first surface having a configuration to receive said top surface of said bottom die, whereby said bottom side of said bottom die is maintained in a plane parallel to said attachment surface;

a second surface recessed in said distal end spaced from and parallel with said first surface to accommodate said substrate and said top die;

at least one pair of spaced-apart walls extending from said distal end of said body, said walls having opposing faces defining an aperture into which said top surface of said bottom die extends, whereby said sub-assembly is maintained in a position relative to said body in at least one direction parallel to said attachment surface; and means disposed at said distal end of said body for holding said sub-assembly.

9. The collet as in claim 8, wherein said first recessed surface extends substantially the length of said substrate.

10. The collet of claim 8 wherein said means for holding comprises a vacuum port disposed in said distal end of said body between said walls for exerting a vacuum pressure in said aperture.

11. The collet of claim 8 further comprising a second pair of spaced apart walls perpendicular to said first pair, said two pairs of walls defining a four-sided aperture.

12. The collet of claim 8, wherein a portion of said first surface is receded, whereby contact between said first surface and said bottom die at edges surrounding said bottom die is minimized.

13. The collet of claim 12, wherein said recessed portion of said first surface is at least partially round in cross-section.

14. The collet of claim 8, wherein said first pair of walls are perpendicular to said first recessed surface, said walls extending distally from said first surface.

* * * * *